United States Patent
Chan et al.

(10) Patent No.: US 12,484,289 B2
(45) Date of Patent: Nov. 25, 2025

(54) METHOD FOR FORMING A STACKED TRANSISTOR DEVICE

(71) Applicant: IMEC VZW, Leuven (BE)

(72) Inventors: Boon Teik Chan, Wilsele (BE); Naoto Horiguchi, Leuven (BE); Julien Ryckaert, Schaerbeek (BE)

(73) Assignee: IMEC VZW, Leuven (BE)

( * ) Notice: Subject to any disclaimer, the term of this patent is extended or adjusted under 35 U.S.C. 154(b) by 371 days.

(21) Appl. No.: 18/322,213

(22) Filed: May 23, 2023

(65) Prior Publication Data

US 2023/0386928 A1 Nov. 30, 2023

(30) Foreign Application Priority Data

May 24, 2022 (EP) .................................... 22175266

(51) Int. Cl.
 *H10D 84/01* (2025.01)
 *H10D 30/01* (2025.01)
 *H10D 84/03* (2025.01)
(52) U.S. Cl.
 CPC ....... *H10D 84/0158* (2025.01); *H10D 30/014* (2025.01); *H10D 84/0128* (2025.01); *H10D 84/0142* (2025.01); *H10D 84/038* (2025.01)
(58) Field of Classification Search
 CPC ................. H10D 30/01; H10D 30/014; H10D 30/019–0198; H10D 30/024;

(Continued)

(56) References Cited

U.S. PATENT DOCUMENTS 10,256,158 B1  4/2019 Frougier et al.
10,957,601 B2  3/2021 Bi et al.
(Continued)

FOREIGN PATENT DOCUMENTS

EP  3588546 A1  1/2020
EP  3945560 A1  2/2022

OTHER PUBLICATIONS

Extended European Search Report and Search Opinion, Application No. EP 22175266.0, mailed Oct. 31, 2022, 11 pages.
(Continued)

*Primary Examiner* — Cheung Lee
(74) *Attorney, Agent, or Firm* — McDonnell Boehnen Hulbert & Berghoff LLP

(57) ABSTRACT

The present disclosure relates to a method for forming a stacked transistor device comprising a lower NSHFET structure and an upper FinFET structure including: forming a fin structure comprising: a lower device sub-stack comprising a number of lower channel nanosheets, a middle insulating layer, an upper device sub-stack comprising an upper channel layer, and a capping layer; forming a process layer embedding the fin structure; subsequent to forming the process layer, removing the capping layer from the fin structure to define a gap exposing the upper device sub-stack; forming spacer layers on opposite side surfaces of the gap to form a reduced-width gap; splitting the upper channel layer by etching back an upper surface thereof via the reduced-width gap to form two upper channel fins; subsequent to forming the upper channel fins, removing the spacer layers; and thereafter: forming a gate structure; and forming source and drain regions for the lower channel nanosheets and the upper channel fins.

20 Claims, 9 Drawing Sheets

(58) Field of Classification Search
CPC ............ H10D 30/0241; H10D 30/031; H10D 30/0321; H10D 30/0323; H10D 30/0327; H10D 30/501–509; H10D 30/6735; H10D 30/674; H10D 30/6757; H10D 30/797; H10D 62/83; H10D 62/832; H10D 64/017; H10D 64/518; H10D 84/01; H10D 84/0128; H10D 84/0142; H10D 84/0158; H10D 84/0167; H10D 84/0177; H10D 84/0193; H10D 84/02; H10D 84/032; H10D 84/035; H10D 84/038; H10D 84/05; H10D 84/07; H10D 84/08; H10D 88/01

See application file for complete search history.

(56) References Cited

U.S. PATENT DOCUMENTS

| | | | |
|---|---|---|---|
| 10,998,233 | B2 | 5/2021 | Xie et al. |
| 11,158,636 | B2 | 10/2021 | Yeh et al. |
| 11,201,152 | B2 | 12/2021 | Xie et al. |
| 2014/0091360 | A1 | 4/2014 | Pillarisetty et al. |
| 2018/0374791 | A1 | 12/2018 | Smith et al. |
| 2020/0035569 | A1 | 1/2020 | Frougier et al. |
| 2020/0235134 | A1 | 7/2020 | Lilak et al. |
| 2021/0183852 | A1 | 6/2021 | Li et al. |
| 2021/0210349 | A1 | 7/2021 | Xie et al. |
| 2021/0408300 | A1 | 12/2021 | Yang et al. |
| 2022/0037318 | A1 | 2/2022 | Huang et al. |

OTHER PUBLICATIONS

Yamagishi, Tomohiko, Atsushi Hori, Iriya Muneta, Kuniyuki Kakushima, Kazuo Tsutsui, and Hitoshi Wakabayashi. "Self-heating-aware cell design for p/n-vertically-integrated nanowire on FinFET beyond 3 nm technology node." Japanese Journal of Applied Physics 59, No. SG (2020): SGGA09.

Kurniawan, Erry Dwi, Yan-Ting Du, and Yung-Chun Wu. "Performance Evaluation of Vertically Stacked Nanosheet InGaAs/InAlAs/InP Double Quantum Well FinFET on Si Substrate." In 2020 International Conference on Radar, Antenna, Microwave, Electronics, and Telecommunications (ICRAMET), pp. 362-365. IEEE, 2020.

Jiang, Liu, Ashish Pal, El Mehdi Bazizi, Mehdi Saremi, He Ren, Blessy Alexander, and Buvna Ayyagari-Sangamalli. "Complementary FET device and circuit level evaluation using fin-based and sheet-based configurations targeting 3nm node and beyond." In 2020 International Conference on Simulation of Semiconductor Processes and Devices (SISPAD), pp. 323-326. IEEE, 2020.

Bao, Ruqiang, K. Watanabe, J. Zhang, Huimei Zhou, M. Sankarapandian, J. Li, Shanti Pancharatnam et al. "Selective enablement of dual dipoles for near bandedge multi-Vt solution in high performance FinFET and nanosheet technologies." In 2020 IEEE Symposium on VLSI Technology, pp. 1-2. IEEE, 2020.

METHOD FOR FORMING A STACKED TRANSISTOR DEVICE

CROSS-REFERENCE TO RELATED APPLICATIONS

The present application is a non-provisional patent application claiming priority to European Patent Application No. EP 22175266.0, filed May 24, 2022, the contents of which are hereby incorporated by reference.

FIELD OF THE DISCLOSURE

The present disclosure relates to a method for forming a stacked transistor device comprising a lower nanosheet field-effect transistor structure and an upper fin field-effect transistor structure.

BACKGROUND

Modern semiconductor integrated circuit technology includes horizontal channel transistors, for example the fin field-effect transistor (FinFET) and the horizontal or lateral nanosheet field-effect transistor (NSHFET). Such devices typically includes a source, a drain, a channel comprising a fin-shaped channel layer (in the case of a FinFET) or one or more horizontally extending channel nanosheets (in the case of a NSHFET), and a gate stack surrounding the channel.

To facilitate more area efficient circuitry, stacked transistor device structures have been developed. An example of a stacked transistor device is the Complementary Field-Effect Transistor (CFET) device. The CFET device comprises a complementary pair of FETs, such as a complementary pair of NSHFETs stacked on top of each other (e.g. a pFET bottom device and an nFET top device, or vice versa). The CFET device allows a reduced footprint compared to a traditional side-by-side arrangement of a pFET and nFET.

Using what may be referred to as a "monolithic" process, a CFET device comprising NSHFET bottom and top devices may be formed by processing of a stack of channel nanosheets to form the bottom device from lower channel nanosheets of the stack and the top device from upper channel nanosheets of the stack. After processing source and drain regions on the lower and upper channel nanosheets (e.g. comprising source and drain epitaxy), the lower and upper channel nanosheets may be provided with a "monolithic" gate stack defining a gate electrode which is physically and electrically common to the top and bottom device.

SUMMARY

While methods for forming stacked transistor devices, such as the CFET device, have been developed, existing processes are typically designed to form a device structure comprising bottom and top devices of a same channel geometry, such as NSHFET bottom and top devices. However, different channel geometries for the bottom and top devices may in some instances provide improved device performance.

In light of the above, it is an objective of the present disclosure to provide a method enabling forming of a stacked transistor device comprising a lower nanosheet field-effect transistor structure and an upper fin field-effect transistor structure.

According to an example embodiment there is provided a method for forming a stacked transistor device comprising a lower nanosheet field-effect transistor (NSHFET) structure and an upper fin field-effect transistor (FinFET) structure, the method comprising:

forming on a substrate a fin structure comprising: a lower device sub-stack comprising a number of lower channel nanosheets, a middle insulating layer on the lower device sub-stack, on the middle insulating layer an upper device sub-stack comprising an upper channel layer, and on the upper device sub-stack a capping layer;

forming a process layer embedding the fin structure;

subsequent to forming the process layer, removing the capping layer from the fin structure to define a gap exposing an upper surface of the upper device sub-stack;

forming spacer layers on opposite side surfaces of the gap to form a reduced-width gap between the spacer layers, the reduced-width gap exposing a central portion of said upper surface;

subsequent to forming the spacer layers, etching back the process layer to a level below the lower device sub-stack;

splitting the upper channel layer by etching back said upper surface via the reduced-width gap to form two upper channel fins on the middle insulating layer;

subsequent to forming the upper channel fins, removing the spacer layers; and thereafter:

forming a gate structure across a channel region of the fin structure, the gate structure comprising a lower gate structure portion surrounding the lower channel nanosheets and an upper gate structure portion surrounding the upper channel fins; and forming source and drain regions for the lower channel nanosheets and the upper channel fins at either side of the channel region.

In an example embodiment, a stacked transistor device comprising an upper FinFET structure comprising two upper channel fins stacked on top of a lower NSHFET structure is formed.

By embedding the fin structure and the capping layer in the process layer and subsequently removing the capping layer, the gap may expose the upper surface of the upper device sub-stack in the process layer. Hence, the gap may be self-aligned with respect to the fin structure. The subsequent forming of the spacer layers on the opposite side surfaces of the gap in the process layer, allows the width of the (self-aligned) gap to be trimmed (i.e. as seen along a direction across the fin structure) such that the upper channel layer may be split into two upper channel fins by etch-back of the exposed central portion of the upper surface of the upper channel layer. The self-alignment may accordingly be conferred also to the upper channel fins with respect to the lower channel nanosheets. Spacer layers may be formed with precise and uniform thickness, e.g. using a conformal sidewall spacer deposition process, wherein the two upper channel fins may be formed with a substantially uniform width.

The presence of the middle insulating layer in the fin structure provides electrical separation between the channel nanosheets of the lower device sub-stack and the upper channel layer of the upper device sub-stack. Additionally, the middle insulating layer provides a separation between the lower and upper device sub-stacks, which may provide a vertical margin facilitating individual processing of the lower and upper device sub-stacks, such as while forming of the gate structure and/or the source and drain regions. This may be better understood from various embodiments of the method set out in more detail below.

Since the method comprises processing of a fin structure comprising both the lower and upper device sub-stacks, the method lends itself for forming of a "monolithic" stacked transistor device, such as a monolithic CFET device.

Although the method may be used to form CFET devices, it is contemplated that the method may be used also to form other non-CFET type stacked transistor devices, which may benefit from a lower NSHFET device and an upper FinFET device.

The term "fin structure" as used herein refers to an elongated layer stack with a longitudinal dimension oriented along the substrate and protruding vertically therefrom.

By "layer stack" is hereby meant a structure of layers, sequentially formed on top of each other.

The terms "lower" and "upper device sub-stack" designates respectively a lower and upper subset of consecutive layers of (the layer stack of) the fin structure.

By the wording "a first layer (or sub-stack) on a second layer (or sub-stack)" in reference to any of the layers (or sub-stacks) of the fin structure is hereby meant that the first layer (or sub-stack) is arranged directly on (i.e. in abutment with) the second layer (or sub-stack).

Relative spatial terms such as "vertical", "upper", "lower", "top", "bottom", "stacked on top of", are herein to be understood as denoting locations or directions within a frame of reference of the stacked transistor device. In particular, the terms may be understood in relation to a normal direction to the substrate, or equivalently in relation to a bottom-up direction of the device layer stack. Correspondingly, terms such as "lateral" and "horizontal" are to be understood as locations or directions parallel to the substrate, i.e. parallel to an upper surface or the main plane of extension of the substrate.

In some example embodiments, forming the fin structure may comprise patterning a layer stack formed on the substrate, the patterning comprising using a hard mask as an etch mask. The fin structure (or plural such fin structures) may hence be precisely and efficiently formed by patterning of a layer stack.

In some example embodiments, the layer stack may comprise a lower sub-stack comprising a number of lower channel layers for forming the lower channel nanosheets, on the lower sub-stack an initial middle insulating layer for forming the middle insulating layer, on the initial middle insulating layer an upper device sub-stack comprising an initial upper channel layer for forming the upper channel layer, and on the upper sub-stack an initial capping layer for forming the capping layer.

In some example embodiments, the method may further comprise, subsequent to forming the process layer, performing a planarization process to planarize the process layer, the planarization process stopping on the capping layer, and thereafter removing the capping layer. The process layer may hence be provided with a planar upper surface and the capping layer may be exposed in a single planarization process. The planarization of the process layer may further facilitate a uniform etch back of the process layer at either side of the fin structure. In embodiments comprising patterning the layer stack using a hard mask as an etch mask, the planarization process may further remove the hard mask.

In some example embodiments, the method may comprise, prior to forming the spacer layers, etching back the process layer to a level below the lower device sub-stack, and thereafter splitting the upper channel layer. This may increase a flexibility in material selection for the process layer and the middle insulating layer in that inadvertent etch back of the middle insulating layer during etch back of the insulating layer may be avoided. For instance, the process layer may be an insulating layer, e.g. of an insulating material with little or no etch contrast with respect to the middle insulating layer.

In some example embodiments, the lower device sub-stack may further comprise a number of sacrificial nanosheets alternating the lower channel nanosheets, and the method may further comprise, subsequent to forming the source and drain regions, selectively removing sacrificial nanosheet portions of the sacrificial nanosheets from the channel region, and thereafter forming the gate structure.

Thereby the lower channel nanosheets of the lower device sub-stack may be "released", such that the gate structure subsequently may be formed also in spaces between the lower channel nanosheets. The lower gate structure portion may thereby form a wrap-around gate with respect to the lower channel nanosheets.

In some example embodiments, the method may further comprise:
  subsequent to forming the source and drain regions, defining in the channel region a first cover spacer with an extension to cover side surface portions of the upper channel fins and to expose side surface portions of the lower device sub-stack; and
  thereafter removing the sacrificial nanosheet portions while using the first cover spacer as an etch mask.

The upper channel fins may hence be masked from the removal process (e.g. etching) of the sacrificial nanosheet portions. An additional advantage is that the sacrificial nanosheet portions may be removed selectively to the upper channel fins also if they are formed of a same or similar semiconductor material. The first cover spacer may be removed after removing the sacrificial nanosheet portions and prior to forming the gate structure.

In some example embodiments, the method may further comprise forming a first block layer by surrounding the channel region of the fin structure with a first block material and etching back the first block material to a level intermediate the lower device sub-stack and the upper channel fins (e.g. a level of the middle insulating layer), wherein forming the first cover spacer may comprise using the first block layer to define the extension of the first cover spacer.

The first block layer may hence facilitate forming the first cover spacer with the afore-mentioned definition, in particular by counteracting forming of the first cover spacer along the lower device sub-stack.

In some example embodiments, the sacrificial nanosheet portions are removed using an etching process selective to the sacrificial nanosheets. Accordingly, the sacrificial nanosheet portions may be formed of a same or similar material as the upper channel layer wherein the etching of the upper channel layer may be counteracted by the first cover spacer.

In some example embodiments, the upper device sub-stack may further comprise a top layer on the upper channel layer, wherein the top layer is used as an etch mask together with the first cover spacer while removing the sacrificial nanosheet portions. The top layer may hence mask the upper channel layer from above during the selective removal of the sacrificial nanosheet portions.

The top layer may be a semiconductor layer of a material different from the upper channel layer. The top semiconductor layer may for example be formed of a same material as the lower channel nanosheets.

In some example embodiments, forming the gate structure may comprise:
- depositing, in the channel region, an initial gate stack on the lower channel nanosheets and the upper channel fins, the initial gate stack comprising a gate dielectric layer and a first work function metal layer on the gate dielectric layer;
- defining in the channel region a second cover spacer with an extension to cover an upper portion of the initial gate stack deposited on the upper channel fins and to expose a lower portion of the initial gate stack deposited on the lower channel nanosheets;
- removing the first work function metal layer of the lower portion of the initial gate stack while using the second cover spacer as an etch mask; and
- thereafter removing the second cover spacer and depositing a second work function metal.

The second cover spacer may hence facilitate providing different gate work function metals (WFM) at the lower channel nanosheets of the lower device sub-stack and the upper channel fins of the upper device sub-stack.

The middle insulating layer may provide an increased process window for the second cover spacer definition by vertically separating the lower and upper device sub-stacks.

The extension of the second cover spacer may be such that at least side surface portions of the upper channel fins are covered.

The first work function metal layer may be of a type corresponding to a conductivity type of the upper fin field-effect transistor structure and the second work function metal layer may be of a type corresponding to a conductivity type of the lower nanosheet field-effect transistor structure.

In some example embodiments, the method may further comprise, subsequent to depositing the initial gate stack, forming a block layer by surrounding the channel region of the fin structure with a block material and etching back the block material to a level intermediate the lower device sub-stack and the upper channel fins, wherein forming the cover spacer comprises using the block layer to define said extension of the second cover spacer. The block layer and the block material may in the following be denoted second block layer and second block material, respectively.

The second block layer may hence facilitate forming the second cover spacer with the afore-mentioned definition, in particular by counteracting forming of the second cover spacer along the lower device sub-stack.

In some example embodiments, the method may further comprise, subsequent to removing the spacer layers, forming a sacrificial gate structure across the channel region of the fin structure, and, subsequent to forming the source and drain regions replacing the sacrificial gate structure with the gate structure, the gate structure being a functional gate structure.

The gate structure may hence be formed in accordance with a replacement metal gate (RMG) process. The sacrificial gate structure enables each of the source and drain regions and the final functional gate structure to be self-aligned with respect to the channel region.

In some example embodiments, forming the source and drain regions may comprise forming epitaxial source and drain bodies of a first conductivity type on opposite end surfaces of channel nanosheet portions of the channel region, and forming epitaxial source and drain bodies of a second conductivity type on opposite end surfaces of upper channel fin portions of the channel region. This enables forming the lower and upper transistor structures of complementary conductivity types.

In some example embodiments, the lower channel nanosheets may be of $SiGe_y$, and the upper channel layer of $SiGe_z$, wherein each one of y and z is greater than or equal to 0 and wherein y differs from z. A Si- and SiGe-based stacked transistor structure may hence be formed.

In some embodiments, the lower channel nanosheets may be of Si (y=0) and the upper channel layer may be of SiGe (z≥0.15), and wherein the method may comprise forming epitaxial source and drain bodies of an n-type on opposite end surfaces of channel nanosheet portions of the channel region, and epitaxial source and drain bodies of a p-type on opposite end surfaces of upper channel fin portions of the channel region.

In some embodiments wherein the lower device sub-stack further comprises a number of sacrificial nanosheets alternating the lower channel nanosheets, the sacrificial nanosheets may be of $SiGe_x$, the lower channel nanosheets of $SiGe_y$, and the upper channel layer of $SiGe_z$, wherein each one of x, y and z is greater than or equal to 0 and y differs from x and z.

The different Ge-content of the sacrificial nanosheets and lower channel nanosheets (x≠y) enables the aforementioned selective removal of the sacrificial nanosheet portions from the channel region.

In some embodiments wherein the upper device sub-stack further comprises a top layer on the upper channel layer, the top layer may be of $SiGe_t$, wherein t differs less from y than from x and z. The top layer may thus be of a Si(Ge)-composition being more similar to the lower channel nanosheets than the sacrificial nanosheets and the top channel layer. The SiGe-based top layer may hence mask the upper channel layer from above during the selective removal of the sacrificial nanosheet portions. The top semiconductor layer may for example be formed of a same material as the lower channel nanosheets (e.g. t=y).

BRIEF DESCRIPTION OF THE DRAWINGS

The present disclosure, as well as additional objects, features and advantages, may be better understood through the following illustrative and non-limiting detailed description, with reference to the appended drawings. In the drawings like reference numerals will be used for like elements unless stated otherwise.

DETAILED DESCRIPTION

The present disclosure includes and describes methods for forming a stacked transistor device, such as a CFET device, according to a number of embodiments will in the following be described with reference to the figures.

Figure 1:
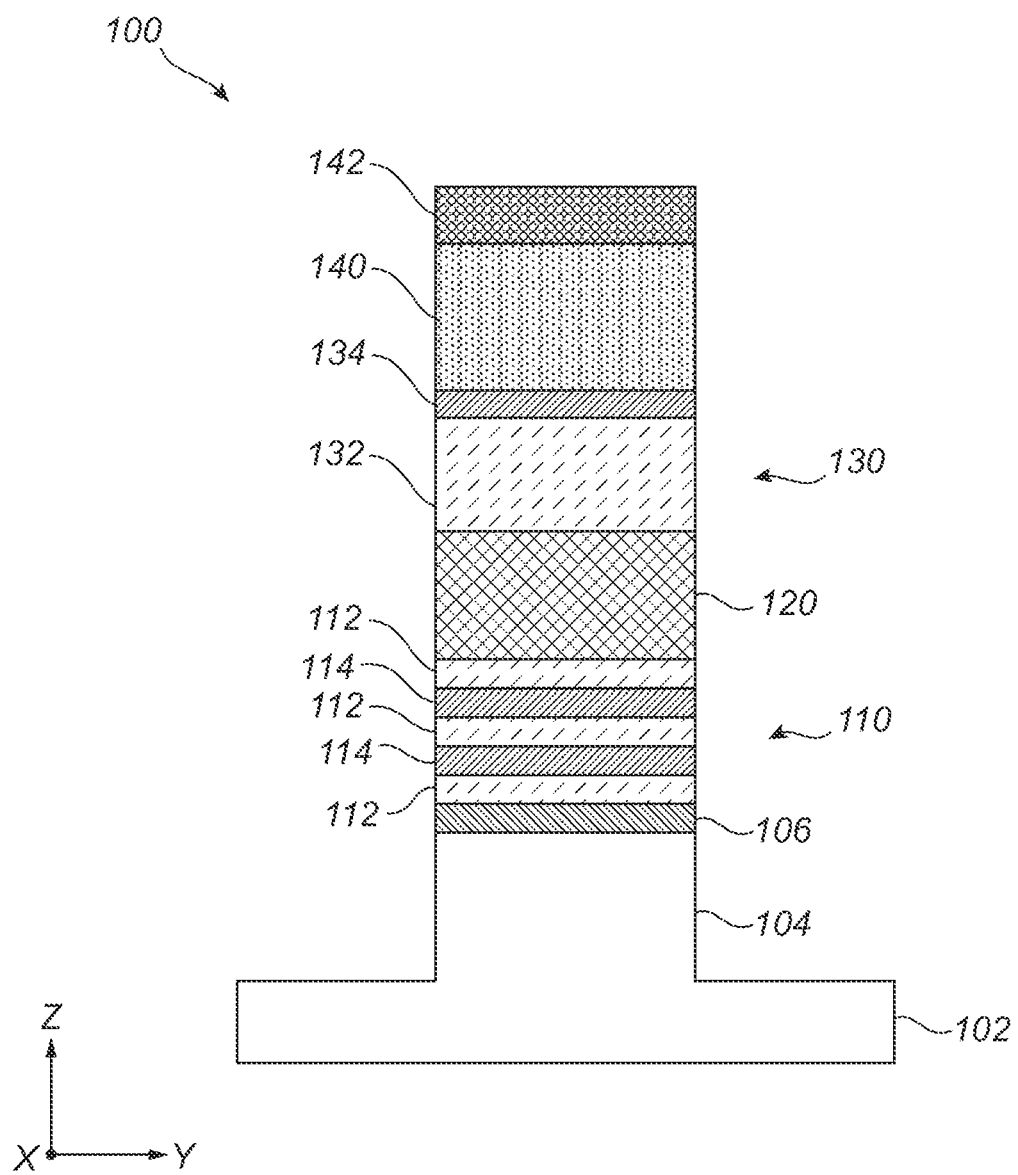
FIGS. 1-9 illustrate a method for forming a fin structure comprising a number of lower channel nanosheets and pair of upper channel fins, according to some embodiments.

FIG. 1 illustrates a fin structure 100 has been formed on a substrate 102. The substrate 102 may be a conventional semiconductor substrate suitable for CMOS processing. The substrate 102 may be a single-layered semiconductor substrate, for instance formed by a bulk substrate such as a Si substrate, a germanium (Ge) substrate or a silicon-germanium (SiGe) substrate. A multi-layered/composite substrate is however also possible, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate.

The fin structure 100 is formed by an elongated fin-shaped layer stack with a longitudinal dimension oriented in a first horizontal direction X along the substrate 102 and protruding in a vertical direction Z from the substrate 102. A width dimension of the fin structure 100 is oriented in a second horizontal direction Y transverse to the X-direction.

The fin structure 100 comprises, in a bottom-up direction, a lower device sub-stack 110, a middle insulating layer 120 on the lower device sub-stack 110, and an upper device sub-stack 130 on the middle insulating layer 120. A capping layer 140 is arranged on the upper device sub-stack 130.

The lower device sub-stack 110 comprises a number of lower channel nanosheets 114 and a number of sacrificial nanosheets 112 arranged alternatingly with the lower channel nanosheets 114, as seen along the Z-direction. The upper device sub-stack 130 comprises an upper channel layer 132. The upper device sub-stack 130 is as seen arranged over of the lower device sub-stack 110 with the middle insulating layer 120 intermediate the lower device sub-stack 110 and the upper device sub-stack 130.

While FIG. 1 illustrates the lower device sub-stack 110 comprising two lower channel nanosheets 114 and three sacrificial layers 112, the number of lower channel nanosheets 114 and sacrificial layers 112 may differ from the depicted example. For example, the lower device sub-stack 110 may comprise a greater number of lower channel nanosheets 114, such as three four, or more, arranged alternatingly with sacrificial layers 112. In particular, each lower channel nanosheet 114 may be arranged between a pair of sacrificial layers 112.

The sacrificial nanosheets 112 are formed of a semiconductor material ("sacrificial material") different from a semiconductor material of the lower channel nanosheets 114 ("lower channel material") and selected to be removable selectively to the lower channel material. As used herein, the term "selective" in connection with removal of a material or feature (e.g. a layer or layer portion) means that the material or feature is removed/removable using an etching process etching the material/feature at a rate greater than another material/feature exposed to the etching process. The upper channel layer 132 may be formed of a semiconductor material ("upper channel material") different from lower channel material. As will be further discussed below, the upper channel material and the sacrificial material may be a same material or different materials.

The sacrificial material may be $SiGe_x$, the lower channel material may be $SiGe_y$, and the upper channel material may be $SiGe_z$, wherein each one of x, y, z≥0, y≠x, y≠z. For example, x≥y+d and z≥y+d where d=0.15. A 0.15 difference in Ge-content (at least) of the sacrificial material and the lower channel material may facilitate a selective removal of the sacrificial material with respect to the lower channel material. For example, the Ge-content of the lower channel material may be 0 (i.e. Si, x=0), the Ge-content of the sacrificial material may be in a range from 0.15 to 0.35, and the Ge-content of the upper channel material may be in a range from 0.15 to 0.65. For example, a SiGe material with a greater Ge content than another Si or SiGe material may be etched selectively (i.e. at a greater rate) using an HCl-based dry etch. A further example is an etching chemistry including an ammonia peroxide mixture (APM). However, other appropriate etching processes (wet or dry) allowing selective etching of higher Ge-content SiGe material with respect to lower Ge-content SiGe (or Si) materials are per se known in the art and may also be employed for this purpose.

A lower channel material of Si and an upper channel material of SiGe lends itself for a CFET device comprising a lower FET of an n-type and an upper FET of a p-type. A SiGe upper channel material may enable forming of a strained upper channel layer 132, which may improve the performance of the channel for the upper FET. More generally, the Ge-content of the lower and upper channel materials may be selected to optimize the channel properties for the lower and upper FET devices. While Si as lower channel material and SiGe as upper channel material may facilitate forming of a lower FET structure and upper FET structure of n-type and p-type respectively, it is envisaged that the method also may be applied to a fin structure comprising SiGe as lower channel material, Si as sacrificial material, and Si as upper channel material. A further example is a fin structure comprising Ge as lower channel material, SiGe as sacrificial material and SiGe as upper channel material.

The sacrificial and lower channel nanosheets 112, 114 may each be formed with a width (along X) to thickness (along Z) ratio greater than 1, such as a width in a range from 10 nm to 30 nm and a thickness in a range from 3 nm to 10 nm. The upper channel layer 132 may be formed with a thickness greater than a thickness of each lower channel nanosheet 114, such as at least twice the thickness of a lower channel nanosheet 114. The upper channel layer 132 may be formed with a thickness in a range from e.g., 20 to 50 nm.

The upper device sub-stack 130 may as shown further comprise a top layer 134 on the upper channel layer 132. The top layer 134 may be formed of a semiconductor material ("top material") different from the upper channel material. For instance, with reference to the above discussed example of a sacrificial material of $SiGe_x$, a lower channel material of $SiGe_y$, and an upper channel material of $SiGe_z$, the top material may be $SiGe_t$, wherein t differs less from y than from x and z, e.g., x≥t+d where d=0.15. For example, each of the lower channel material and the top material may be Si (i.e., x=t=0). The top layer 134 may e.g., be formed with a thickness in a range from 5 to 10 nm. As will be further described below, the top layer 134 may serve as an etch mask for the upper channel layer 132 during selective removal of the sacrificial material of the sacrificial layers 112. As an alternative to a semiconductor top layer 134, a top layer 134 of an oxide or nitride (e.g., $SiO_2$ or SiN) may also provide the function of an etch mask for the upper channel layer 134. An advantage with a semiconductor top layer 134 is however that forming of a tri-gate with respect to the upper device sub-stack 130 may be facilitated, whereas an oxide or nitride top layer 134 may result in a dual-gate for the upper device sub-stack 130.

To facilitate forming of a bottom isolation layer underneath the lower NSHFET structure, the fin structure 100 may as shown in FIG. 1 further comprise a bottom sacrificial nanosheet 106, underneath a bottom-most sacrificial layer 112 and bottom-most channel layer 114 of the lower device sub-stack 110, to be replaced by an insulating material as further described below. The bottom sacrificial nanosheet 106 may be formed of a semiconductor material ("bottom sacrificial material") different from the sacrificial nanosheets 112 and the lower channel nanosheets. The bottom sacrificial material may be SiGe, such as $SiGe_b$, where b≥x+d with d=0.15. For example, the Ge-content of the bottom sacrificial material may be in a range from 0.4 to 0.5, the Ge-content of the lower channel material may be 0 (i.e. Si, x=0), the Ge-content of the sacrificial material (of the lower sacrificial nanosheets 112) may be in a range from 0.15 to 0.35, and the Ge-content of the upper channel material may be in a range from 0.15 to 0.65. The bottom sacrificial layer 106 may be formed as a nanosheet with a thickness similar to the lower channel layers 114 and/or the sacrificial nanosheets 112, such as 10 nm or thereabout.

The sacrificial layers 112, the lower channel layers 114, the upper channel layer 132, and the top layer 134 and the bottom sacrificial layer 106 (if present), may each be formed as epitaxial layers, i.e., layers formed using an epitaxial growth or deposition process.

The middle insulating layer 120 may be formed of an insulating material, such as an oxide or a nitride. For example, the middle insulating layer 120 may comprise or be formed of $SiO_2$, SiN, SiC, SiCN, SiOCN, SiOBCN or SiON. The middle insulating layer 120 may for example be formed with a thickness in a range from 20 to 50 nm. Although referred to and illustrated as a single layer, the middle insulating layer 120 may also be formed as a composite layer structure comprising, e.g., a stack of two or more different insulating layers.

The capping layer 140 may be formed of an insulating material, such as an oxide or a nitride. In any case, the capping layer 140 is to be formed of a material different from a process layer 152 which subsequently is to be formed to embed the fin structure 100, as described with reference to FIG. 2 below. In case of a process layer 152 of an oxide, such as $SiO_2$, the capping layer 140 may for example be formed of SiN or SiCN.

The nanosheets and layers of the fin structure 100 may each be epitaxial nanosheets and layers, e.g. formed of epitaxially grown or deposited semiconductor material. Epitaxial deposition techniques, such as chemical vapor deposition (CVD) or physical vapor deposition (PVD) of Si and SiGe, allowing forming of high-quality material crystalline (e.g. single-crystalline) nanosheets or layers are per se known in the art.

An initial lower device sub-stack comprising an alternating arrangement of sacrificial layers and lower channel layers may be epitaxially grown on the substrate 102. The forming of the initial lower device sub-stack may optionally be preceded by epitaxy of an optional bottom sacrificial layer. An initial upper device sub-stack comprising a channel layer and (optionally) a top layer may be epitaxially grown on a separate donor substrate and transferred and bonded to an upper surface of the initial lower device sub-stack on the substrate 102 by an initial middle insulating layer. After removing the donor substrate from the initial upper device sub-stack (e.g., thus exposing an upper surface of the initial upper device sub-stack), an initial capping layer (in which the capping layer 140 is to be formed) may be deposited on an upper surface thereof. The upper surface may e.g., be formed by an initial top layer (in which the optional top layer 134 is to be formed) or an initial upper channel layer (in which the upper channel layer 132 is to be formed). The fin structure 100 may subsequently be formed by patterning the thusly formed (initial) layer stack to define the fin structure 100, e.g., an elongated fin-shaped device layer stack extending in the X-direction. While the figures depict only a single fin structure 100, it is to be understood that a plurality of parallel fin-structures stacks may be formed in the initial layer stack. The patterning of the initial layer stack may comprise depositing and then patterning a hard mask layer to form a hard mask 142, e.g., a grating of parallel and line-shaped portions of the hard mask layer, one portion for each fin structure to be formed. Conventional patterning techniques may be used for patterning the hard mask layer, e.g. single patterning techniques such as lithography and etching ("litho-etch") or multiple-patterning techniques such as (litho-etch)', self-aligned double or quadruple patterning (SADP or SAQP). The pattern defined by the hard mask 142 may then be transferred into the layer stack by etching using the hard mask 142 as an etch mask. As shown in FIGS. 1a-b, the fin patterning may extend into an upper thickness portion of the substrate 102 to form a base portion 104. A height or thickness of the base portion 104 may for example be in a range from 20 to 80 nm.

As an alternative to forming the initial upper device sub-stack on a donor substrate, the initial layer stack may be formed by first forming the initial lower device sub-stack by epitaxy, then forming an intermediate sacrificial semiconductor layer on the initial lower device sub-stack (e.g. a SiGe-layer with a Ge-content greater than the sacrificial layers 112 and 106), and then forming the initial upper device sub-stack on the intermediate sacrificial semiconductor layer. After patterning one or more initial fin structures in the initial layer stack, the intermediate sacrificial semiconductor layer of each initial fin structure may be replaced with an insulating material (e.g., an oxide or a nitride such as $SiO_2$ or SiN) by selectively removing the intermediate sacrificial semiconductor layer and then filling the resulting elongated cavity in each fin structure with the insulating material to form the middle insulating layer 120. A temporary support structure comprising one or more elongated support structures (e.g. one or more lines of amorphous Si or another sacrificial material) extending across the one or more fin structures may be formed to support the fin structures during the replacement process, and removed thereafter.

Figure 2:
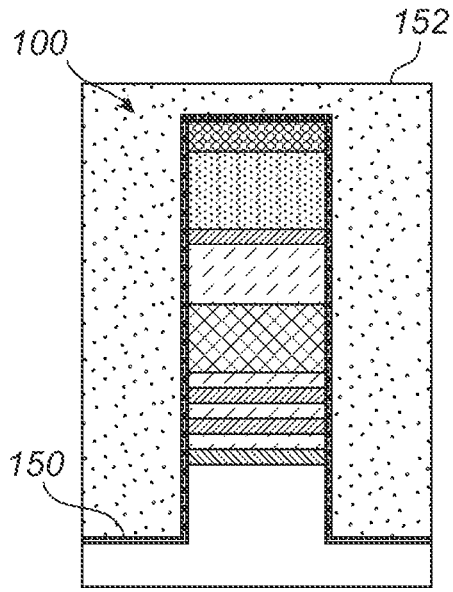
Figure 9:
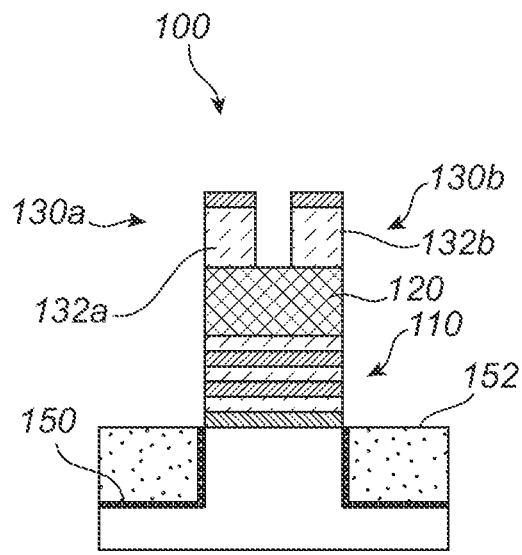

In FIG. 2 a process layer 152 embedding the fin structure 100 has been formed. The process layer 152 may be deposited to-down to surround and cover the fin structure 100 (e.g., completely filling the trenches between the fin structures and forming an overburden over the fin structures). In the following, it will be assumed that the process layer 152 is formed of an insulating material such as $SiO_2$, e.g., deposited by CVD such as flowable-CVD (FCVD), or some other low-k inter-layer dielectric suitable for shallow trench isolation (STI). However, the process layer 152 may also be formed of a sacrificial material such as an organic spin-on material (e.g., spin-on-carbon) to be removed and replaced by STI material after forming two upper channel fins 132a, 132b as shown in FIG. 9.

Prior to depositing the insulating material of the process layer 152, the fin structure 100 may as shown in FIG. 2 be covered by a liner layer 150, e.g., of a nitride such as SiN. The liner 150 may serve to mask the fin structure 100 from the process conditions during deposition of the process layer 152. The liner 150 may as shown be conformally deposited. By the term "conformal deposition" is hereby meant a deposition process resulting in a conformally growing layer or film. Conformal deposition may be achieved using an atomic layer deposition (ALD) process. Correspondingly the term "conformal layer" is to be understood as a layer deposited by conformal deposition.

Figure 3:
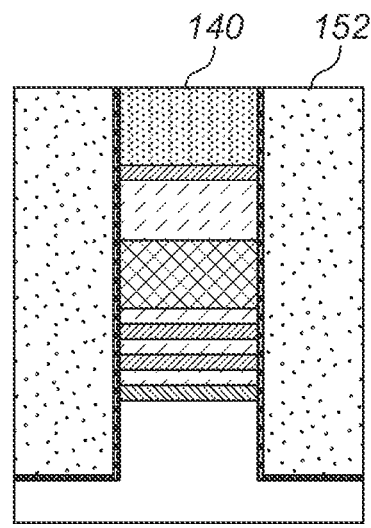

In FIG. 3 the process layer 152 has been subjected to a planarization process, e.g., chemical mechanical polishing (CMP), planarizing the process layer 152 and removing the hard mask 142. The planarization process is stopped on the capping layer 140. FIG. 3 shows the result after performing the planarization process, wherein the process layer 152 is provided with a planar upper surface flush with an upper surface of the capping layer 140.

Figure 4:
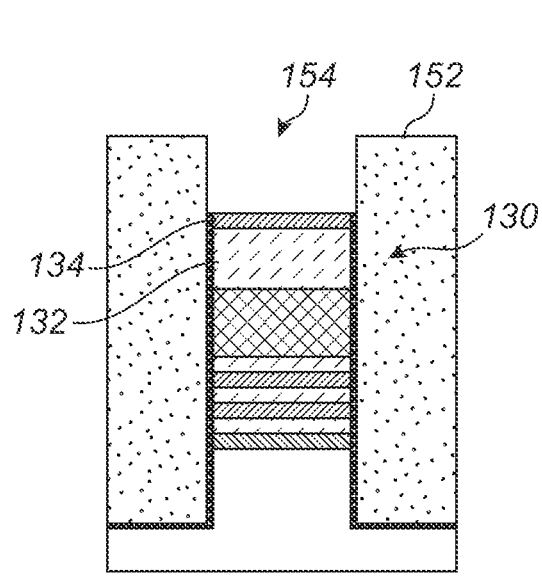

In FIG. 4 the capping layer 140 has been removed to define a gap or opening 154 exposing an upper surface of the upper device sub-stack 130 in the process layer 152. The gap 154 is coextensive with the longitudinal dimension (along the X-direction) of the fin structure 100 and has a width or width dimension across the longitudinal dimension of the fin structure 100 (along the Y-direction). The capping layer 140 may be removed e.g., using a wet or dry isotropic etching process. The top layer 134 (if present) may be used as an etch stop layer.

As an alternative to the approach shown in FIGS. 3-4, the planarization process may be stopped on the hard mask 142, wherein subsequently both the hard mask 142 and then the capping layer 140 may be removed by etching, e.g., using a first etching chemistry for removing the hard mask 142 and a second etching chemistry for removing the capping layer 140.

Figure 5:
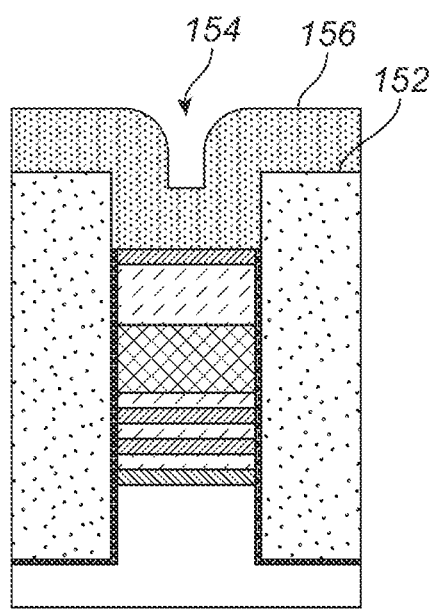
Figure 6:
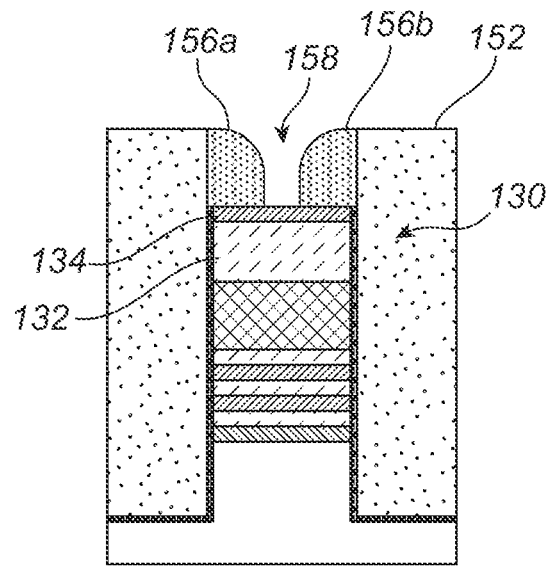

In FIGS. 5-6 a spacer material layer 156 has been conformally deposited on the process layer 152 and in the gap 154 (FIG. 5) and then etched such that discrete spacer layers 156a, 156b remain on opposite side surfaces of the gap 154. A reduced-width gap 158 is thereby formed between the spacer layers 156a, 156b which exposes a central portion of the upper surface of the upper device sub-stack 130. The spacer material layer 156 may e.g., be an ALD-deposited nitride or carbide, e.g. SiN, SiCO, SiOCN, or SiC. The spacer material layer 156 may be etched back (e.g., top-down, in the negative Z direction) using an anisotropic etch process, such as reactive ion etching. As may be appreciated from FIG. 6, the spacer layers 156a, 156b allows the width of the initial gap 154 to be trimmed to define the reduced-width gap 158. The width of the reduced width gap 158 may correspond to the width of the initial gap 154 minus twice the thickness of the spacer layers 156a, 156b.

Figure 7:
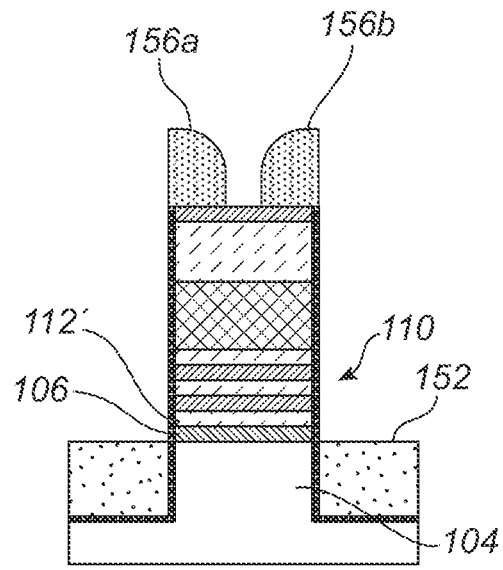

In FIG. 7 the process layer 152 has been etched back (along the negative Z direction) to a level below the lower device sub-stack 110, i.e. below a bottom-most sacrificial layer 112'. As shown, the process layer 152 may further be etched back to a level below the optional bottom sacrificial layer 106 to facilitate its subsequent replacement with a bottom insulating layer. In any case, the etch back may be stopped while a thickness portion of the process layer 152 remains to define STI surrounding the base portion 104 of the fin structure 100. The process layer 152 may be etched back using an anisotropic etching process etching the process layer 152 (e.g., $SiO_2$) selectively to the spacer layers 156a, 156b (e.g., SiN).

Figure 8:
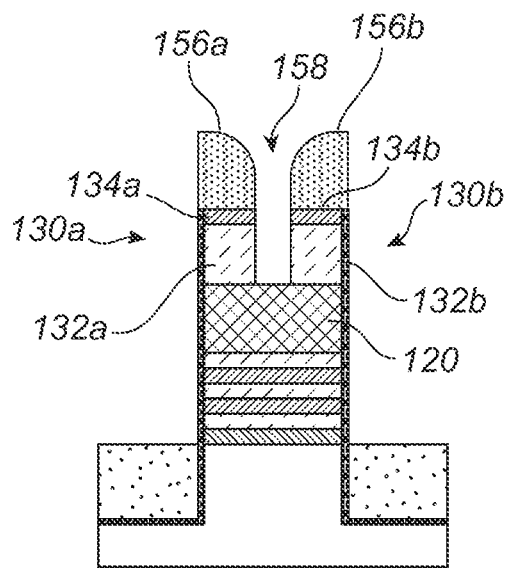

In FIG. 8, the upper device sub-stack 130 including the upper channel layer 152 and the optional top layer 156, has been split by etching back the exposed upper surface of the upper device sub-stack 130 via the reduced-width gap 158 while using the spacer layers 156a, 156b as etch masks. Two sub-stack parts 130a, 130b have thereby been formed on the middle insulating layer 120, comprising a respective upper channel fin 132a, 132b and respective top layer parts 134a, 134b thereon. The upper device sub-stack 130 may be etched back using an anisotropic etching process and using the middle insulating layer 120 as an etch stop layer. The sub-stack parts 130a, 130b and the upper channel fins 132a, 132b are coextensive with the longitudinal dimension (along the X-direction) of the fin structure 100. As may be appreciated, a resulting width of the sub-stack parts 130a, 130b and the upper channel fins 132a, 132b may be controlled through the thickness of the spacer layers 156a, 156b, wherein a greater thickness results in a more narrow reduced width gap 158 and a corresponding increased width of the upper channel fins 132a, 132b.

Provided the middle insulating layer 120 is formed of a different material than the process layer 152, the order of the splitting of the upper channel layer 152 and the etch back of the process layer 152 may be reversed, without the etch back of the process layer 152 causing any appreciable etch back of the surface of the middle insulating layer 120 exposed between the upper channel fins 132a, 132b.

In FIG. 9, subsequent to splitting the upper device sub-stack 130, the spacer layers 156a, 156b have been removed, e.g., employing an etching process selective to thereto. As further shown, portions of the optional liner 150 exposed above the process layer 152 may be removed from the fin structure 100 by etching. FIG. 9 accordingly depicts the resulting processed fin structure 100 comprising the lower device sub-stack 110, the middle insulating layer 120 and the two upper device sub-stack parts 130a, 130b comprising the two upper channel fins 132a, 132b. The fin structure 100 may subsequently be further processed to form a gate structure and source and drain regions for the lower channel nanosheets 114 and the upper channel fins 132a, 132b.

Figure 10A:
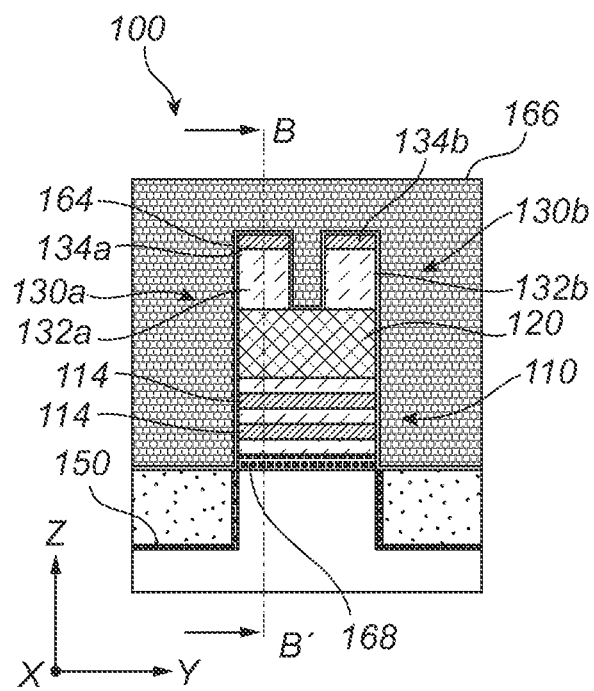
FIGS. 10a-b, 11a-b and 12-15 illustrate a method for defining released lower channel nanosheets, according to some embodiments.
Figure 10B:
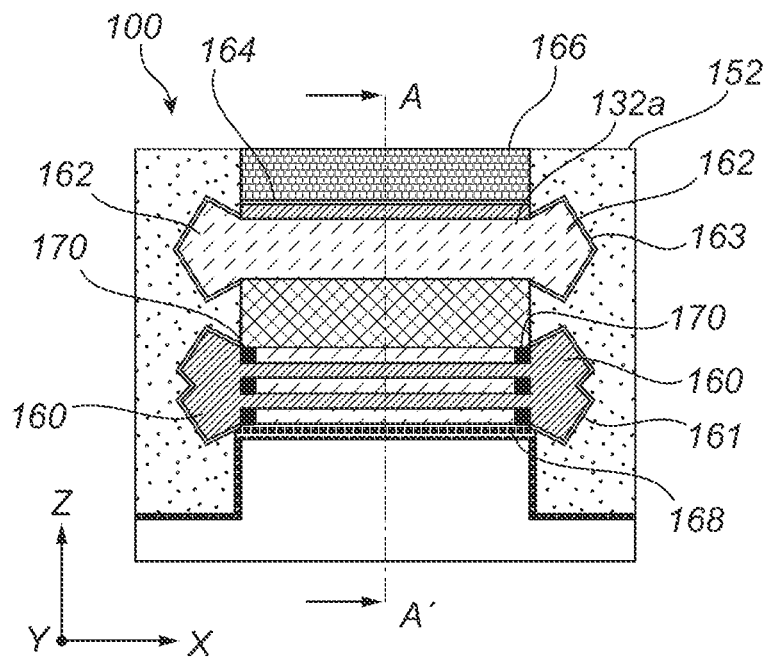

FIGS. 10a-b depict the fin structure 100 of FIG. 9 after having been subjected to further processing to form a sacrificial gate structure 166 across a channel region of the fin structure 100 and source and drain regions 160, 162 for the lower channel nanosheets 114 and the upper channel fins 132a, 132b, at either side of the channel region. FIG. 10b is depicts a cross-section of the fin structure 100 along the vertical plane B-B' indicated in FIG. 10a. The vertical plane A-A' indicates the cross sectional plane shown in FIG. 10a.

The sacrificial gate structure 166 may be formed by depositing and then patterning a sacrificial gate layer of e.g. amorphous Si. Reference sign 164 denotes a protective liner layer (e.g. an oxide such as $SiO_2$) which may be conformally deposited on the fin structure 100 prior to the deposition of the sacrificial gate layer. Although not shown in the figures, a gate spacer of a conventional gate spacer material may be provided on sidewalls of the sacrificial gate structure 166. It is to be understood that a plurality of parallel sacrificial gate structure 166 may be formed across the fin structure 100 (and across each of a plurality of fin structures).

After forming the sacrificial gate structure 166 the fin structure 100 may be recessed by etching back the fin structure 100 in a top-down direction (e.g. negative Z) while using the sacrificial gate structure 166 as an etch mask. The etching may extend through the upper device sub-stack parts 130a, 130b, the middle insulating layer 120 and the lower device sub-stack 110. Portions of the upper device sub-stack parts 130a, 130b including the portions of the upper channel fins 132a, 132b, a portion of the middle insulating layer 120 and portions of the lower device sub-stack 110 including the lower sacrificial nanosheets 112 and the lower channel nanosheets 114 are preserved in the channel region underneath the sacrificial gate structure 166.

After recessing the fin structure 100, the source and drain regions 160 and 162 may be formed by epitaxially growing semiconductor source and drain bodies on end surfaces of the portions of the lower channel nanosheets 112 and the portions of the upper channel fins 132a, 132b exposed at either sides of the channel region and the sacrificial gate structure 166.

The source and drain bodies 160 formed on the channel nanosheets 112 may be of a first conductivity type (e.g. n-type on Si-channel nanosheets) and the source and drain bodies 162 formed on the upper channel fins 132a, 132b may be of a second opposite conductive type (e.g. p-type on SiGe-upper channel fins). The doping may be provided by in-situ doping. Different conductivity types of the source and drain bodies 160 and 162 may be achieved by masking the end surfaces of the upper channel fins 132a, 132b (and top channel parts 134a, 134b) while performing epitaxy on the lower channel nanosheets 114. The masking may for example be provided by forming a temporary cover spacer along the end surfaces of the upper device sub-stack parts 132a, 132b. A temporary cover spacer may be formed in a similar manner as the first cover spacer shown in FIG. 13 (e.g., forming a block mask surrounding the lower device sub-stack 110, then forming the temporary cover spacer along the upper device sub-stack parts 132a, 132b over the block mask using a conformal sidewall spacer deposition process, and then removing the block mask). After completing the epitaxy, the temporary cover spacer may be removed and the source and drain regions 160 may be covered with an etch stop layer 161 (e.g., an ALD-deposited nitride) and an inter-layer dielectric (e.g., CVD-deposited $SiO_2$). Epitaxy may then be performed on the upper channel fins 132a, 132b to form the source and drain bodies 162. This is however merely one example and other process techniques, such as Si/SiGe area selective epitaxy, facilitating forming of the source and drain regions 160, 162 of different conductivity types may also be used.

After forming an etch stop layer 163 corresponding to etch stop layer 161 also on the source and drain bodies 162, insulating material may as shown be deposited over the source and drain regions 160, 162, planarized and recessed (e.g., by CMP) to form an insulating layer with a planar upper surface flush with an upper surface of the sacrificial gate structure 166. As the insulating material may comprise a same inter-layer dielectric as the process layer 152 (e.g., $SiO_2$), the reference sign 152 is used also for the resulting insulating layer covering surrounding the sacrificial gate structure 166 and covering the source and drain regions 160, 162.

If the fin structure 100 includes the bottom sacrificial layer 106 (see e.g., FIG. 1), the bottom sacrificial layer 106 may, subsequent to forming the sacrificial gate structure 166 and prior to recessing the fin structure 100, be removed by selectively etching the bottom sacrificial layer 106, and subsequently filling the thusly formed longitudinal cavity in the fin structure 100 with an insulating material (e.g., a nitride or oxide) for instance deposited by ALD. A bottom isolation layer 168 may hence be formed underneath the lower device sub-stack 110, as depicted in FIGS. 10a-b. During the replacement process the fin structure 100 may be supported by the sacrificial gate structure(s) 166.

To facilitate among others a subsequent "channel release", to be described below, so-called "inner spacers" 170 may be formed on end surfaces of the sacrificial nanosheets 112 prior to forming the source and drain regions 160, 162, by laterally recessing the sacrificial nanosheets 112 from both sides of the sacrificial gate 166 (along the X and negative X directions) using an isotropic etching process selective to the sacrificial material, and filling the recesses with an inner spacer material (e.g. an ALD-deposited oxide, nitride or carbide). The inner spacers 170 may thus mask the source/drain regions 160, 162 during the subsequent channel release step.

Figure 11A:
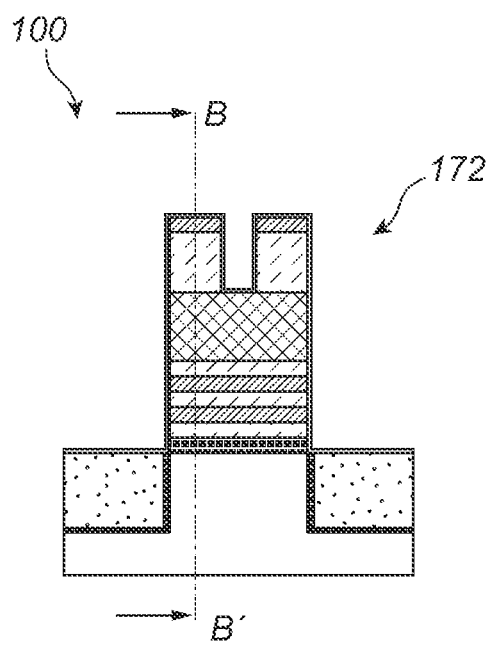
Figure 11B:
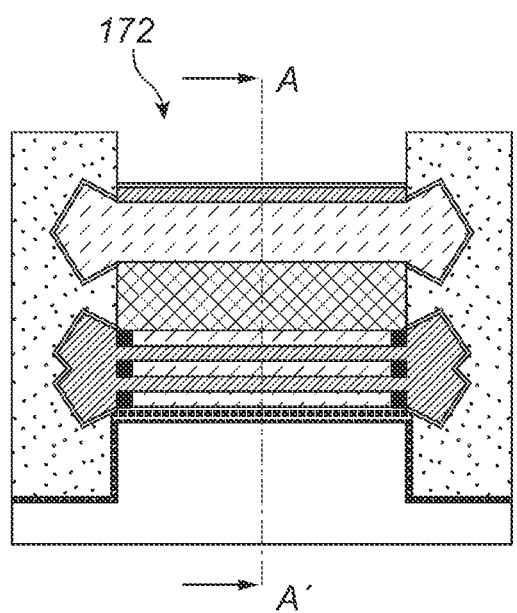

In FIGS. 11a-b (showing cross sections corresponding to those in FIGS. 10a-b) the sacrificial gate structure 166 has been removed to define a gate trench 172 in the process/insulating layer 152, the gate trench 172 extending across the channel region of the fin structure 100. Any suitable etching process (isotropic or anisotropic, wet or dry) allowing selective removal of the sacrificial gate structure 166 (e.g. of amorphous Si) may be used.

Figures 12, 13:
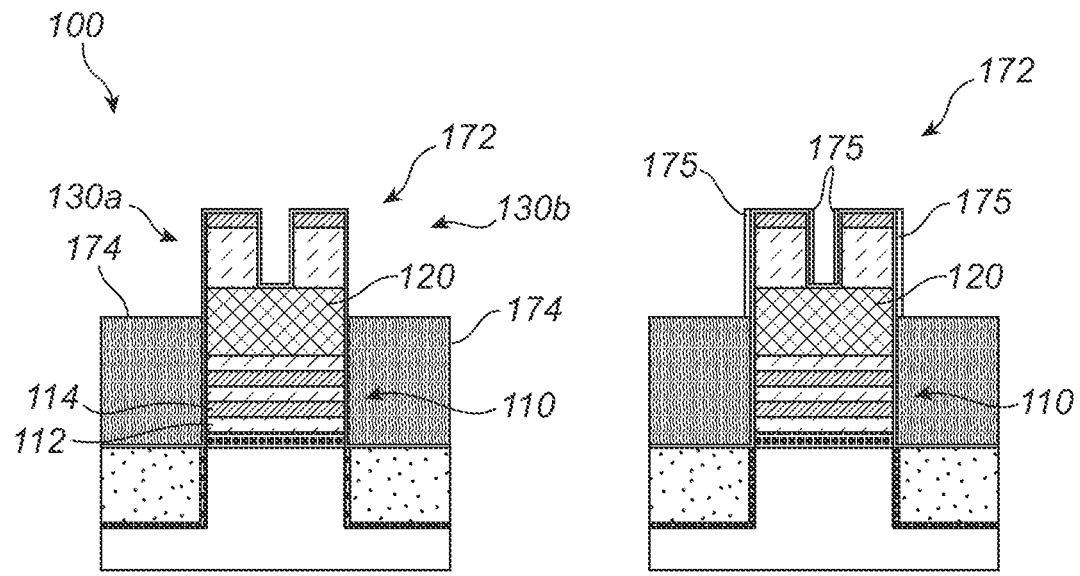
Figures 14, 15:
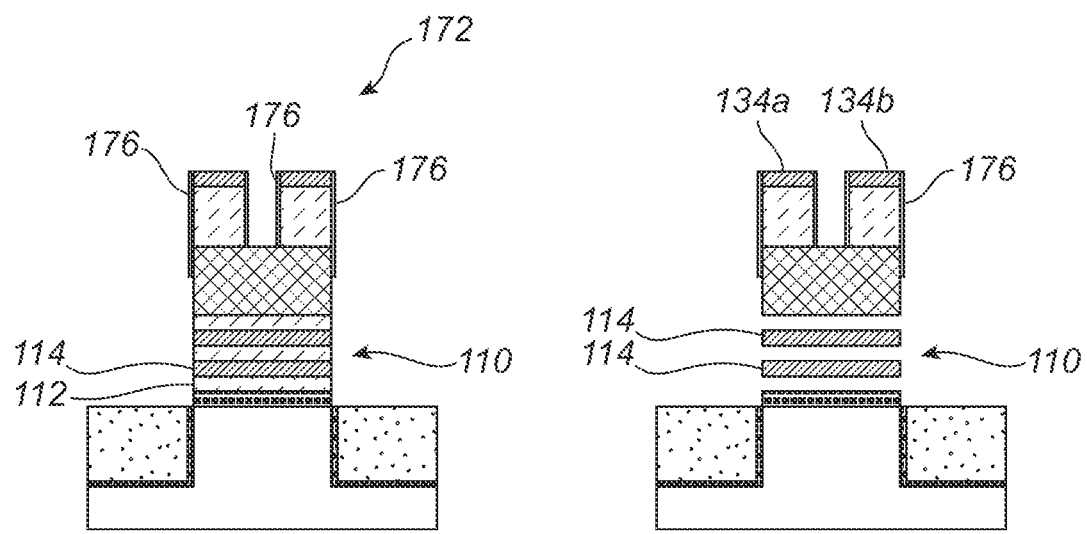

FIGS. 12-15 each show the fin structure 100 along the same cross FIGS. as FIG. 11a, i.e. along the gate trench 172 and through the channel region. FIGS. 12-15 depict processing, subsequent to forming the source and drain regions 160, 162, for defining a first cover spacer 176 in the channel region and thereafter performing a channel release process of removing the sacrificial nanosheet portions 112 while using the first cover spacer 176 as an etch mask. More specifically, FIGS. 12-14 depict the defining of the first cover spacer 176 while FIG. 15 depicts the channel release.

In FIG. 12 a first block layer 174 has been formed by surrounding the fin structure 100 with a first block material in the channel region and then etching back the first block material top-down (along negative Z direction) to a level intermediate the lower device sub-stack 110 and the upper device sub-stack parts 130a, 130b. More specifically, the first block material may be deposited in the gate trench 172, e.g., to completely fill the gate trench 172, and then etched back to a level coinciding with the middle insulating layer 120. The first block material may for instance be an organic spin on material, such as spin-on-carbon.

After forming the first block layer 174, the first block layer 174 may be used to define the extension of the first cover spacer 176. More specifically, a cover spacer mask material may be conformally deposited (e.g., a nitride such as SiN deposited by ALD) on the first block layer 174 and on portions of the liner layer 164 exposed over the first block layer 174, and then etched back top-down such that the cover spacer mask material is removed from the first block layer 174 and remains to define a cover spacer mask 175 along the side surface portions of the upper device sub-stack (FIG. 13). The first block layer 174 may subsequently be removed (e.g. using a suitable isotropic wet or dry etching process) and the liner layer 164 may be patterned using the cover spacer mask 175 as an etch mask such that the remaining portions of the liner layer 174 defines the first cover spacer 176 (FIG. 14). The first block layer 174 and the liner layer 164 may be patterned using a suitable isotropic wet or dry etching process.

As shown in FIG. 14, the first cover spacer 176 is thus defined with an extension to cover side surfaces of the upper device sub-stack parts 130a, 130b, including the inwardly facing and mutually opposite side surface portions of the upper channel fins 132a, 132b and the outwardly facing side surface portions of the upper channel fins 132a, 132b, are covered, and expose side surfaces of the lower device sub-stack 110, including the end surfaces of the portions of the sacrificial nanosheets 112 and the lower channel nanosheets 114.

After forming the first cover spacer 176, the portions of the sacrificial nanosheets 112 may be removed from the channel region and the gate trench 172, thereby defining released or suspended channel nanosheet portions 114 in the channel region, as shown in FIG. 15. An etching process selective to the sacrificial material of the sacrificial nanosheets 112 may be used. For example, SiGe sacrificial material may be removed selectively to Si channel material (or SiGe channel material with a lower Ge-content than the SiGe sacrificial material) using HCl or APM. During the etching of the sacrificial nanosheets 112, the first cover spacer 176 may together with the top layer parts 134a, 134b act as an etch mask for the upper channel fins 132a, 132b. The resulting top layer parts 134a, 134b may be especially beneficial in case the upper channel material and the sacrificial material have a same or similar composition (e.g. a same or similar Ge-content). Conversely, in case the compositions of the upper channel material and the sacrificial material are dissimilar to provide a sufficient etch contrast during the etching of the sacrificial material, the top layer 134 and top layer parts 134a, 134b may be omitted.

According to an alternative approach for defining a first cover spacer, which e.g. may be used in case no liner layer 164 is present, the method may after forming the first block layer 174 as shown in FIG. 12, proceed by conformally depositing a first cover spacer material (e.g. a nitride such as SiN deposited by ALD) on the first block layer 174 and on side surfaces portions of the fin structure 100 exposed over the first block layer 174, and then etching back the first cover spacer material top-down such that the first cover spacer material is removed from the first block layer 174 and remains to define the first cover spacer on the side surface portions of the fin structure 100 with an extension corresponding to the first cover spacer 176 as shown in FIG. 14. The method may then proceed as shown in FIG. 15. In both the illustrated approach and this alternative approach, the first block layer 174 is accordingly used to define the extension of a first cover spacer.

Figure 16A:
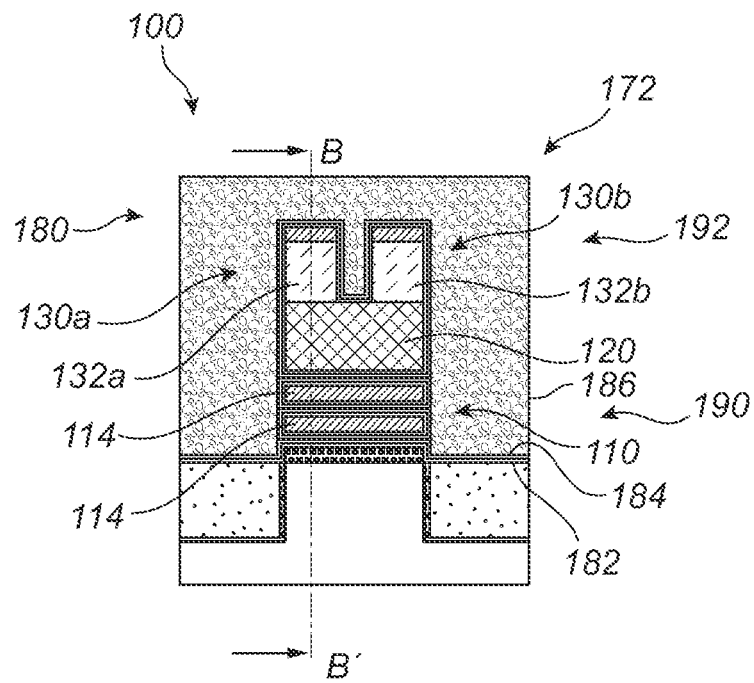
FIGS. 16a-b illustrate a method for forming a functional gate structure, according to some embodiments.
Figure 16B:
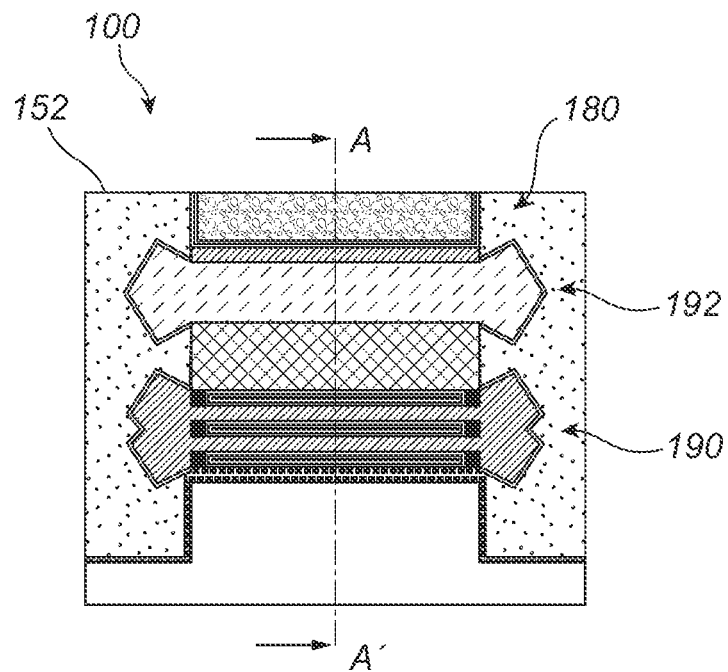

After performing the release of the channel nanosheets 114, the first cover spacer 176 may be removed and the method may proceed as shown in FIGS. 16a-16b (showing cross sections corresponding to those in FIGS. 10a-b) wherein a gate stack forming the final functional gate structure 180 of the stacked transistor device has been formed in the gate trench 172, surrounding the lower channel nanosheets 114 and the upper channel fins 132a, 132b, and thus completing the replacement of the sacrificial gate structure 166. Accordingly, a stacked transistor device has been formed comprising: a lower NSHFET structure 190 comprising the lower channel nanosheets 114, source and drain regions 160 and a lower portion of the gate structure 180; and an upper FinFET structure 192 comprising the upper channel fins 132a, 132b, source and drain regions 162 and an upper portion of the gate structure 180. The lower portion of the gate structure 180 defines a gate-all around for the lower channel nanosheets 114. The upper portion of the gate structure 180 defines either a tri-gate with respect to each of the upper channel fins 132a, 132b (in case top layer parts 134a, 134b are absent or formed of semiconductor) or a double-gate (in case top layer parts 134a, 134b of an insulating material are present).

The gate stack of the gate structure 180 may comprise a gate dielectric layer 182, one or more effective a work function metal (WFM) layers 184 and a gate fill metal 186. The gate dielectric layer 182 may be formed of a conventional a high-k dielectric e.g., $HfO_2$, HfSiO, LaO, AlO or ZrO. The WFM layer 184 may be formed of one or more effective WFMs (e.g., an n-type WFM such as TiAl or TiAlC and/or a p-type WFM such as TiN or TaN). The gate fill metal 186 may be formed of conventional gate fill metals e.g. W, Al, Co or Ru. The gate dielectric layer and the first WFM may be deposited by ALD. The gate fill metal 186 may for instance be deposited by CVD or physical vapor deposition (PVD). The gate stack may after deposition be recessed using a metal etch-back process to provide the functional gate structure 180 with a desired vertical dimension.

The method may thereafter proceed with forming source/drain contacts by etching contact trenches in the insulating layer 152 and depositing one or more contact metals in the trenches, on the source and drain regions 160, 162. Separate contacting of the source and drain regions 160 of the lower device and the source and drain regions 162 of the upper device may be achieved by a first contact metal deposition in the contact trenches, etch back of the contact metal to a level between the source and drain regions 160 and 162, thus exposing the source and drain regions 162, deposition of an insulating contact separation layer on the etched back contact metal, and subsequently a second contact metal deposition over the source and drain regions 162. Separate source and drain contacting may be applied to either or both sides of the device gate structure 180.

For improved device performance of CFET device wherein the lower NSHFET structure 190 and the upper FinFET structure 192 are of complementary conductivity types (e.g., n- and p-type respectively) a multi-threshold voltage ("multi-VT") gate stack may be formed. Such a multi-VT gate stack may comprise a first WFM layer of a type corresponding to a conductivity type of the upper FinFET structure 192 (e.g., p-type) and a second WFM layer of a type corresponding to a conductivity type of the lower NSHFET structure 190 (e.g., n-type). An approach enabling forming of such a gate stack will now be disclosed with reference to FIGS. 17-24.

Figure 17:
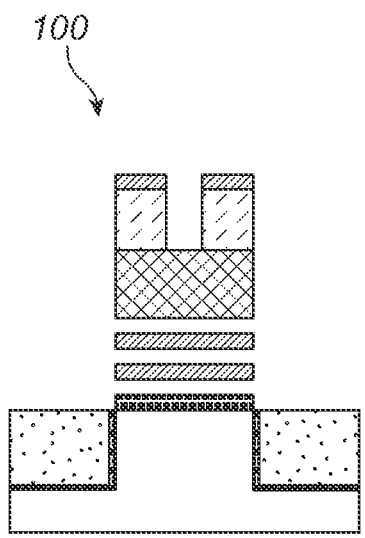
FIGS. 17-24 illustrate a further method for forming a functional gate structure, according to some embodiments.

FIG. 17 shows the fin structure 100 after performing the release of the channel nanosheets 114 and removing the first cover spacer 176.

Figure 18:
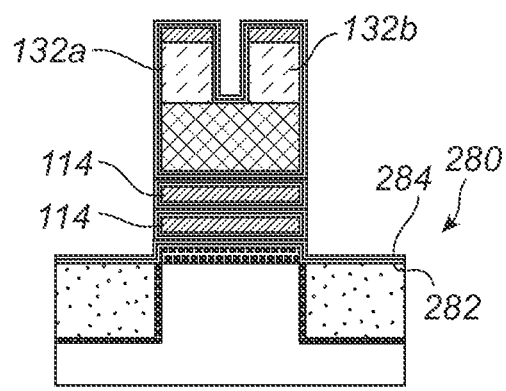

FIG. 18 shows an initial gate stack 280 formed on the lower channel nanosheets 114 and the upper channel fins 132a, 132b and comprising a gate dielectric layer 282 and WFM layer 284 corresponding to layers 182 and 184 discussed in connection with FIGS. 16a-b. The WFM layer 284 may in the following be denoted "first WFM layer 284" and may for example be a p-type WFM.

Figure 19:
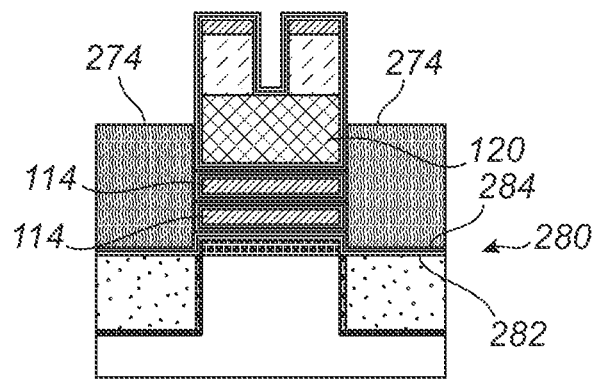
Figure 20:
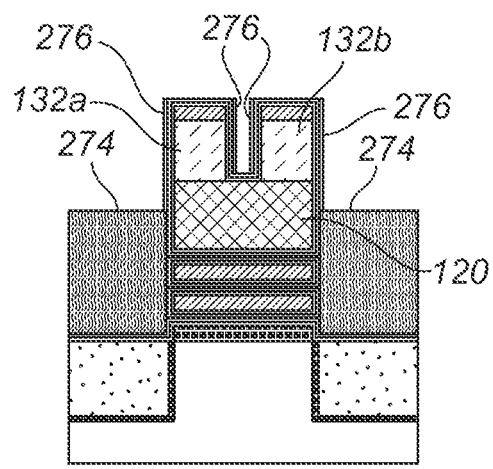
Figure 21:
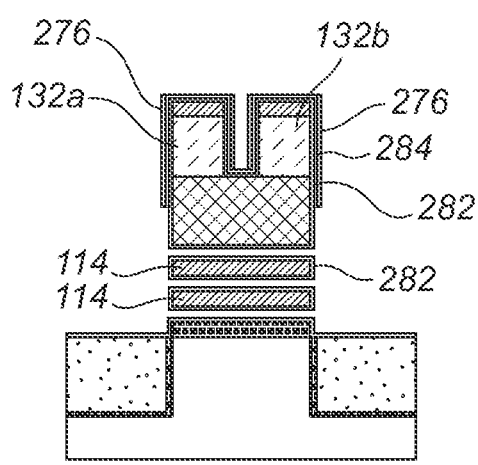

FIGS. 19-21 depict processing for defining a second cover spacer 276 in the channel region with an extension to cover an upper portion of the initial gate stack 280 deposited on the upper channel fins 132a, 132b and to expose a lower portion of the initial gate stack 280 deposited on the lower channel nanosheets 114 (FIGS. 19-20); and then removing the first WFM layer 284 from the lower channel nanosheets 114 while using the second cover spacer 276 as an etch mask (FIG. 21). A second WFM layer 286 (e.g., of an n-type WFM) may then be deposited on the gate dielectric layer 282 on the lower channel nanosheets 114 (FIG. 23).

In FIG. 19 a second block layer 274 has been formed by surrounding the fin structure 100 with a second block material in the channel region and then etching back the second block material top-down (along negative Z direction) to a level intermediate the upper channel fins 132a, 132b and the lower channel nanosheets 114, e.g., to a level coinciding with the middle insulating layer 120. The second block material may for instance be an organic spin on material, such as spin-on-carbon.

After forming the second block layer 274, the second block layer 274 may be used to define the extension of the second cover spacer 276. More specifically, a second cover spacer material may be conformally deposited (e.g., a nitride such as SiN deposited by ALD) on the second block layer 274 and on portions of the first WFM layer 284 exposed over the second block layer 274, and then etched back top-down such that the second cover spacer material is removed from the second block layer 274 and remains to define the second cover spacer 276 along the side surface portions of the upper device sub-stack parts 130a, 130b, including the channel fins 132a, 132b (FIG. 20). The second block layer 274 may subsequently be removed (e.g. using a suitable isotropic wet or dry etching process) and the first WFM layer 284 may etched while using the second cover spacer 276 as an etch mask such that the first WFM layer 284 is removed from the lower channel nanosheets 114 and is preserved on the upper channel fins 132a, 132b. The first WFM layer 284 may be removed using a suitable isotropic wet or dry metal etching process.

Figure 23:
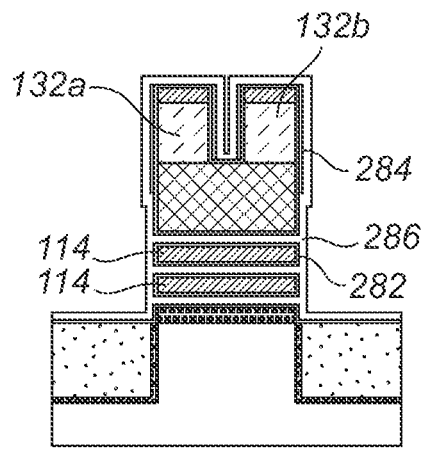
Figure 24:
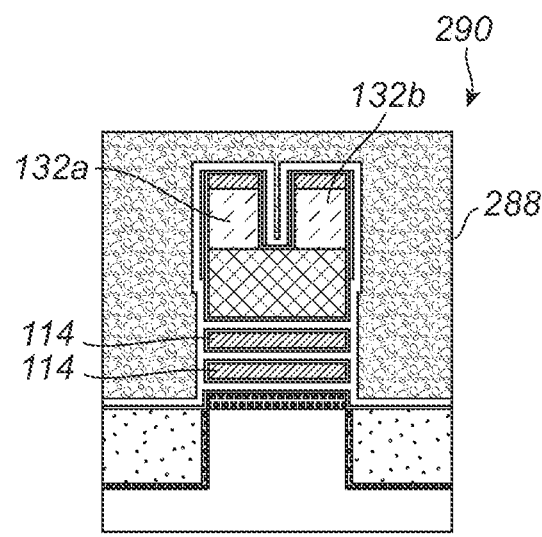

FIGS. 23-24 show the resulting final gate structure 290 after depositing the second WFM layer 286 (e.g., an n-type WFM deposited by ALD) and then a gate fill metal 288 corresponding to the gate fill metal 186 discussed in connection with FIGS. 16a-b. The lower NSHFET structure 190 accordingly comprises a lower portion of the gate structure 290 surrounding the lower channel nanosheets 114 and comprising the gate dielectric layer 282, the second WFM layer 286 and the gate fill metal 288. The upper FinFET structure 192 comprises an upper portion of the gate structure 290 surrounding the upper channel fins 132a, 132b and comprising the gate dielectric layer 282, the first WFM layer 284, the second WFM layer 286 and the gate fill metal 288.

Figure 22:
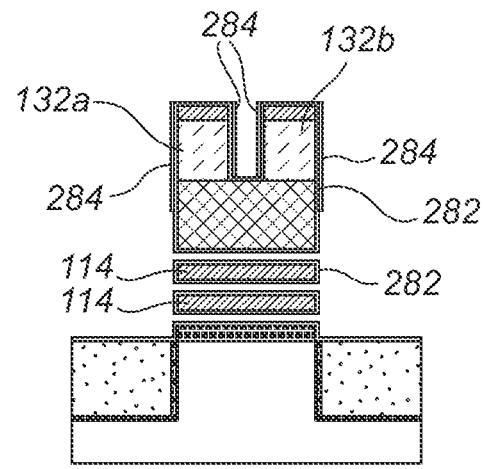

As may be appreciated from FIGS. 20-22, the etch back of the second cover spacer material may result in loss of second cover spacer material deposited over the upper channel fins 132a, 132b. Accordingly, the extension of the second cover spacer 276 may be such that the portions of the first WFM layer 284 on top of the upper channel fins 132a, 132b (and on an upper surface of the middle insulating layer 120 between the upper channel fins 132a, 132b) are exposed during the etching of the first WFM layer 284 and thus removed therefrom. In case there the top layer 134 is of a semiconductor or a top layer 134 is omitted, this may together with the second WFM layer 286 result in a changed threshold voltage along the upper surfaces of the upper channel fins 132a, 132b. As the upper channel fins 132a, 132b typically may be formed with a vertical dimension greater than a width, the impact on device performance of the upper FinFET structure 192 may however be limited.

After forming the gate structure 290, the method may proceed with forming source/drain contacts as discussed above.

In the above, the present disclosure has mainly been described with reference to a limited number of examples. However, as is readily appreciated, other examples than the ones disclosed above are equally possible within the scope of the present disclosure, as defined by the appended claims.

What is claimed is:

1. A method for forming a stacked transistor device comprising a lower nanosheet field-effect transistor structure and an upper fin field-effect transistor structure, the method comprising:
    forming on a substrate a fin structure comprising: a lower device sub-stack comprising a number of lower channel nanosheets, a middle insulating layer on the lower device sub-stack, on the middle insulating layer an upper device sub-stack comprising an upper channel layer, and on the upper device sub-stack a capping layer;
    forming a process layer embedding the fin structure;
    subsequent to forming the process layer, removing the capping layer from the fin structure to define a gap exposing an upper surface of the upper device sub-stack;
    forming spacer layers on opposite side surfaces of the gap to form a reduced-width gap between the spacer layers, the reduced-width gap exposing a central portion of said upper surface;
    subsequent to forming the spacer layers, etching back the process layer to a level below the lower device sub-stack;
    splitting the upper channel layer by etching back said upper surface via the reduced-width gap to form two upper channel fins on the middle insulating layer;
    subsequent to forming the upper channel fins, removing the spacer layers; and thereafter:
    forming a gate structure across a channel region of the fin structure, the gate structure comprising a lower gate structure portion surrounding the lower channel nanosheets and an upper gate structure portion surrounding the upper channel fins; and
    forming source and drain regions for the lower channel nanosheets and the upper channel fins at either side of the channel region.

2. The method of claim 1, wherein forming the fin structure comprises patterning a layer stack formed on the substrate using a hard mask as an etch mask.

3. The method of claim 2, further comprising, subsequent to forming the process layer, performing a planarization process to planarize the process layer, the planarization process stopping on the capping layer, and thereafter removing the capping layer.

4. The method of claim 3, wherein the lower device sub-stack further comprises a number of sacrificial nanosheets alternating the lower channel nanosheets, and the method further comprises, subsequent to forming the source and drain regions, selectively removing sacrificial nanosheet portions from the channel region, and thereafter forming the gate structure.

5. The method of claim 2, wherein the lower device sub-stack further comprises a number of sacrificial nanosheets alternating the lower channel nanosheets, and the method further comprises, subsequent to forming the source and drain regions, selectively removing sacrificial nanosheet portions from the channel region, and thereafter forming the gate structure.

6. The method of claim 1, further comprising, subsequent to forming the process layer, performing a planarization process to planarize the process layer, the planarization process stopping on the capping layer, and thereafter removing the capping layer.

7. The method of claim 1, wherein the lower device sub-stack further comprises a number of sacrificial nanosheets alternating the lower channel nanosheets, and the method further comprises, subsequent to forming the source and drain regions, selectively removing sacrificial nanosheet portions from the channel region, and thereafter forming the gate structure.

8. The method of claim 7, further comprising:
    subsequent to forming the source and drain regions, defining in the channel region a first cover spacer with an extension to cover side surface portions of the upper channel fins and to expose side surface portions of the lower device sub-stack; and
    thereafter removing the sacrificial nanosheet portions while using the first cover spacer as an etch mask.

9. The method of claim 8, further comprising forming a first block layer by surrounding the channel region of the fin structure with a first block material and etching back the first block material to a level intermediate the lower device sub-stack and the upper channel fins, wherein forming the first cover spacer comprises using the first block layer to define said extension of the first cover spacer.

10. The method of claim 9, wherein the sacrificial nanosheet portions are removed using an etching process selective to the sacrificial nanosheets.

11. The method of claim 8, wherein the sacrificial nanosheet portions are removed using an etching process selective to the sacrificial nanosheets.

12. The method of claim 11, wherein the upper device sub-stack further comprises a top layer on the upper channel layer, wherein the top layer is used as an etch mask together with the first cover spacer while removing the sacrificial nanosheet portions.

13. The method of claim 7, wherein the lower channel nanosheets are of $SiGe_y$, and the upper channel layer is of $SiGe_z$, wherein each one of y and z is greater than or equal to 0 and wherein y differs from z.

14. The method of claim 13 wherein the sacrificial nanosheets are of $SiGe_x$, wherein x is greater than or equal to 0 and y differs from x and z.

15. The method of claim 14, wherein the upper device sub-stack further comprises a top layer on the upper channel layer, wherein the top layer is of $SiGe_t$ and wherein t differs less from y than from x and z.

16. The method of claim 1, wherein forming said gate structure comprises:
depositing in the channel region an initial gate stack on the lower channel nanosheets and the upper channel fins, the initial gate stack comprising a gate dielectric layer and a first work function metal layer on the gate dielectric layer;
defining in the channel region a second cover spacer with an extension to cover an upper portion of the initial gate stack deposited on the upper channel fins and to expose a lower portion of the initial gate stack deposited on the lower channel nanosheets;
removing the first work function metal layer of the lower portion of the initial gate stack while using the second cover spacer as an etch mask; and
thereafter removing the second cover spacer and depositing a second work function metal.

17. The method of claim 16, further comprising, subsequent to depositing the initial gate stack, forming a block layer by surrounding the channel region of the fin structure with a block material and etching back the block material to a level intermediate the lower device sub-stack and the upper channel fins, wherein forming the second cover spacer comprises using the block layer to define said extension of the second cover spacer.

18. The method of claim 1, further comprising, subsequent to removing the spacer layers, forming a sacrificial gate structure across the channel region of the fin structure, and, subsequent to forming the source and drain regions replacing the sacrificial gate structure with said gate structure.

19. The method of claim 1, wherein forming the source and drain regions comprises forming epitaxial source and drain bodies of a first conductivity type on opposite end surfaces of channel nanosheet portions of the channel region, and forming epitaxial source and drain bodies of a second conductivity type on opposite end surfaces of upper channel fin portions of the channel region.

20. The method of claim 1, wherein the lower channel nanosheets are of $SiGe_y$, and the upper channel layer is of $SiGe_z$, wherein each one of y and z is greater than or equal to 0 and wherein y differs from z.

* * * * *